United States Patent [19]

Johnson

[11] Patent Number: 4,657,137
[45] Date of Patent: Apr. 14, 1987

[54] MULTI-CHIP PACKAGING SYSTEM
[75] Inventor: Carl W. Johnson, Neenah, Wis.
[73] Assignee: North American Philips Corporation, New York, N.Y.
[21] Appl. No.: 266,564
[22] Filed: May 22, 1981
[51] Int. Cl.$^4$ .............................................. B65D 73/02
[52] U.S. Cl. .................... 206/329; 206/330; 206/332; 206/328; 206/460
[58] Field of Search ............... 206/329, 330, 331, 332, 206/328, 324, 390, 460, 820, 484, 480, 477, 486

[56] References Cited

U.S. PATENT DOCUMENTS

| | | | |
|---|---|---|---|
| 2,372,072 | 3/1945 | Flaws, Jr. | 206/56 |
| 2,903,139 | 9/1959 | Penman | 206/332 |
| 3,095,677 | 7/1963 | Dreyus et al. | 206/390 |
| 3,195,796 | 7/1965 | Buttery | 206/453 |
| 3,266,704 | 8/1966 | Deeren | 206/558 |
| 3,394,388 | 7/1968 | Kuchlin | 206/458 |
| 3,608,711 | 10/1969 | Wiesler | 206/330 |
| 4,154,344 | 5/1979 | Yenni, Jr. et al. | 206/524.6 |
| 4,298,120 | 11/1981 | Kaneko et al. | 206/329 |
| 4,341,825 | 7/1982 | Kemski | 206/484 |

FOREIGN PATENT DOCUMENTS

| | | | |
|---|---|---|---|
| 0013979 | 6/1980 | European Pat. Off. | 13/02 |
| 0016368 | 2/1981 | European Pat. Off. | 13/04 |
| 1401991 | 8/1978 | United Kingdom | 15/04 |
| 1401992 | 8/1978 | United Kingdom | 15/04 |
| 2040569 | 3/1980 | United Kingdom | 73/02 |

Primary Examiner—Joseph Man-Fu Moy
Assistant Examiner—David T. Fidei
Attorney, Agent, or Firm—Jack E. Haken; James J. Cannon, Jr.

[57] ABSTRACT

A system for packaging leadless electronic and electrical components for automatic component placement machines including a low-cost, disposable, flexible engineered laminated carrier tape on which leadless components are held, a reel for winding said component tape, the reel being fabricated with a core of solid fiber chipboard and side discs sheets of coated kraft paper such that the carrier tape may be sealed within the coated paper side sheets of the reel and peeled from side sheets while unwinding. The flexible engineered laminated carrier tape includes a stable base layer member, a flexible, expandable and compressible upper member layer of the laminated carrier tape structure, and a creped top cover tape as required including tape drive engaging means integrally formed with said base layer member and spaced recessed areas formed in said carrier tape for receiving leadless components, and further including means to determine the presence or absence of components in each of said recessed areas after the carrier tape is loaded with components.

9 Claims, 17 Drawing Figures

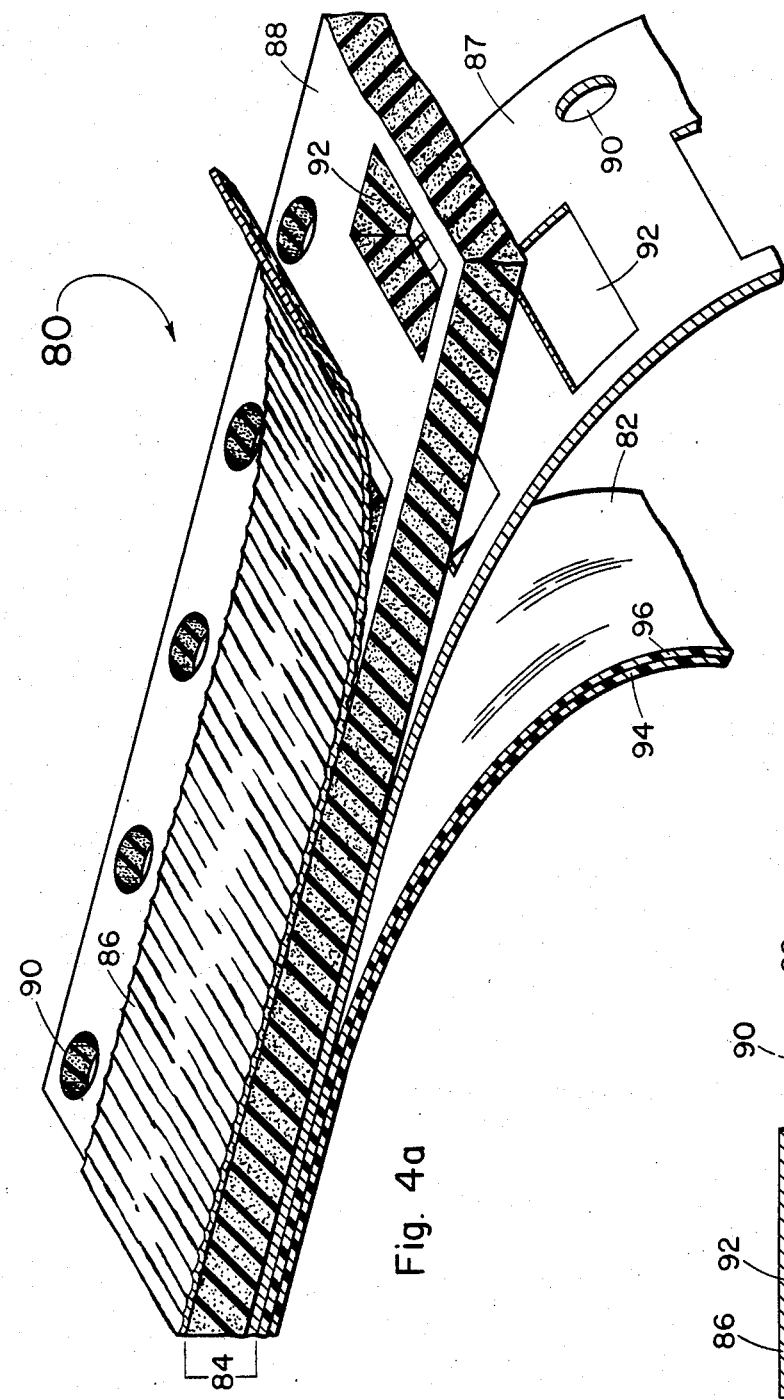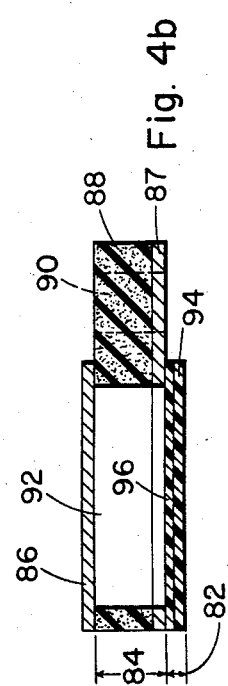
Fig. 4a
Fig. 4b

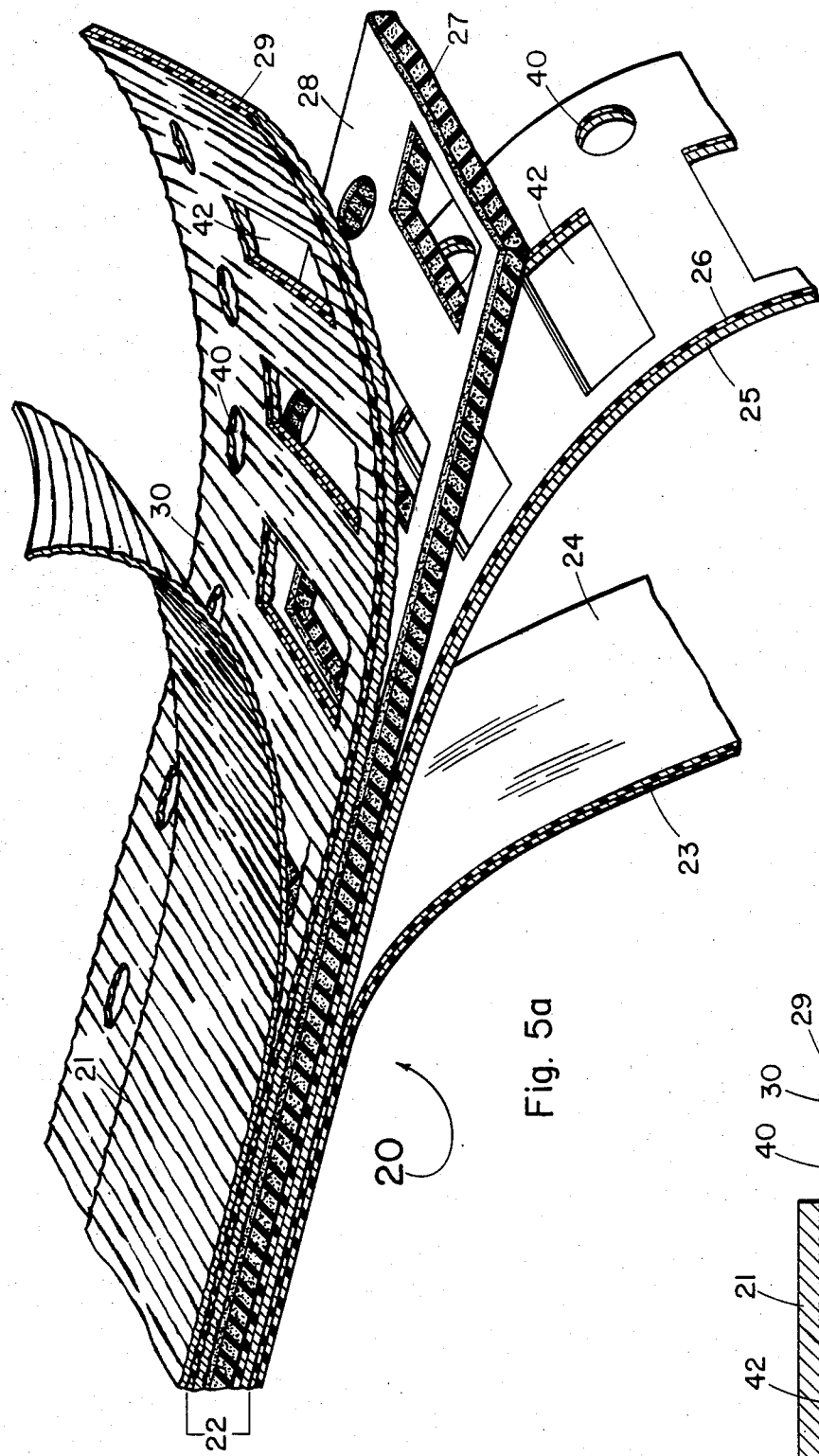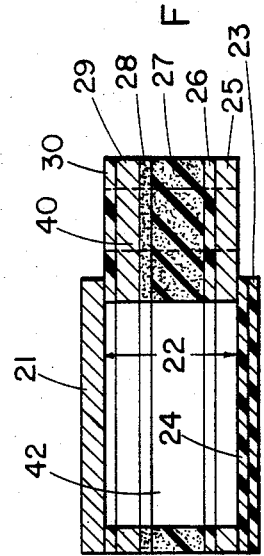
Fig. 5a
Fig. 5b

MULTI-CHIP PACKAGING SYSTEM

BACKGROUND OF THE INVENTION

1. Field of the Invention

This invention pertains to a system for packaging leadless electronic and electrical components for automatic component placement machines. The system includes a carrier tape on which the leadless components are held, the reel on which the component tape is wound, and the construction of the tape itself. Leadless components include chip capacitors, chip resistors, chip transistors and chip integrated circuits in general rectangular configuration and, where applicable, cylindrical components, specifically capacitors and resistors, jumpers, mini-mold transistors, diodes and other components not specifically mentioned, provided that these components may be taped in accordance with the specifications in EIA Standard Proposal No. 1460 or, if approved, standard RS-481 as of March 1981.

2. Description of the Prior Art

With the current trend toward miniaturization of electrical and electronic components and the additional trend toward automation of manufacturing and assembly in the electrical and electronic industries, systems which automatically place small leadless components on printed circuit boards have been developed. High speed automated component production is achieved from initial manufacture through final testing. Chip component placement machines currently handle approximately 1,000 to 8,000 chips per hour. One of the major problems in systems for factory automation is the gap between packaging and placement of chips. Packaging machinery has tended to be rapid but expensive in terms of packaging chips for placement. The insertion of the packages of chips into placement machines has been cumbersome and expensive. The present invention is one of several intended to smooth the handling of chip components from final test to placement on printed circuit boards at somewhat comparable rates of speed and at reasonable cost.

With the extensive use of chip components, several methods of chip packaging have been developed for automatic placement of chips. Cassette type packages, such as that disclosed in Netherlands patent application Ser. No. 8006058, provide a means of packaging chips at the manufacturing facility in a cassette which later can be placed in an automatic multi-chip placement machine, such as that disclosed in U.S. patent application Ser. No. 235,802, filed Feb. 11, 1981. An alternative means of delivering chips to an automatic placement machine is a tape system. Tape systems have been developed and sold by a number of component companies including Panasonic (Matsushita), TDK, the DYNA/PERT Division of Emhart Corporation and others. It appears that the taping of leadless components for automatic placement will become the dominant means of delivering chip components to automatic placement machines. Accordingly, the Electronic Industries Association devoted considerable effort between 1979 and 1981 to developing standards for taping. Tape systems are based on tape dimensions similar to those of super 8 movie film, the tape being wound on reels similar to those of super 8 movie film and fed through a drive mechanism. The tentative EIA standards proposal No. 1460, which, if approved, will be published as RS-481, prescribes dimensions and tolerances required to tape leadless components such that they may be automatically placed on printed circuit boards. The EIA standard covers many leadless components, specifically chip capacitors, chip resistors and chip transistors in general rectangular configuration, as well as for cylindrical components, specifically capacitors and resistors, jumpers, mini-mold transistors, diodes and other components not specifically mentioned, provided that these components may be taped in accordance with the standards. The standard also prescribes container and reel marking requirements.

With respect to the tape, the EIA standard prescribes carrier tape dimensions based on a super 8 tape in which sprocket holes are punched along one edge of the tape and cavities are punched in the balance of the tape for components. Two standards are available for tapes, one covers a carrier tape which is frequently made of a cardboard having sprocket holes and component cavities, which are spaced recesses or apertures, punched in an eight millimeter wide cardboard carrier. Components are held in the cavities in this carrier tape by top and bottom cover tapes only 5.2 millimeters wide so that the cover tapes will not interfere with the sprocket holes. The standard also defines a plastic embossed tape in which cavities are formed by embossing in a plastic tape 8 mm wide and a 5.2 mm top cover tape is used to hold the components in place in the embossed cavities. The standard further defines reel dimensions for the reels on which tapes may be wound as well as the dimensions for drive spokes or key slots, if such drive spokes or key slots are necessary. The standard further prescribes specifications for placement of polar units within the taping system.

The proposed standard also includes related considerations. It prescribes that the components must be prevented from falling out of the component window or cavity of the tape, which is normally overcome by fixing cover tapes on one or both sides of the carrier tape. Fixing tapes or cover tapes must not protrude beyond the edges of the carrier tape nor can they cover the sprocket holes. Tapes in adjacent layers must not stick together in packing or winding. The adhesive of the fixing tape should not adversely effect the mechanical and electrical characteristics and marking of the components. The tapes must be suitable to withstand the storge of the taped components without danger of migration of silver terminations or the giving off of vapors which would make soldering difficult or deteriorate the component properties or terminations by chemical action. In addition, the adhesive shall not become detached so that the components do not remain in position after storage and the carrier tape material shall therefore lose strength such that it breaks on unreeling when the taped components are fed from the package by hand or into the assembly machines. Removal of the top or bottom fixing tapes must not cause material to be removed from carrier tape and must not cause delamination of the carrier tape. The top tape shall be the fixing or cover tape on the outermost surface when the carrier tape is wound on a reel. Component identification marking, if used, shall face toward the top side of the tape. The bottom side of the chip, the side that contacts the printed circuit board, shall face the bottom tape. A maximum of 0.25% of the components per reel may be missing with no more than three consecutive components missing.

The prior art, as it has evolved, presents to the manufacturer and the use of leadless components several problems to which the present invention is directed. Among these problems are the cost of taping leadless or chip components, the cost of packaging the tapes of components and the delivery systems for feeding a plurality of reels to automatic placement equipment. In terms of cost, the manufacturers of chip components find that the cost of tape, reels and protective container for the reels of tape is currently 4 to 10 times the desirable goal.

Since the carrier tape is designed to hold chip components, it will have a certain thickness. In the prior art the thick portion of a carrier tape which, under the proposed standard, ranges from 0.94 millimeters and 1.75 millimeters in thickness, was traditionally made of a cardboard, chip board or similar substance which could be wound on reels. The carrier tape further included a cover tape on its bottom and a cover tape on its top, the function of the cover tape being to retain the components in position on the carrier tape. A major problem with the carrier tape of the prior art was that the tape has an inherent tendency to unwind from a reel and return to a linear position rather than a circular position, the clock spring effect. The reason for this tendency is obvious. When wound on a reel, the bottom of the tape has a tendency to be in compression whereas the top of the tape has a tendency to be in tension. Given the relatively rigid materials from which the tapes were made, the winding of the tape induced two effects, a clock spring effect whereby the tape has a tendency to unwind and to return to a normal linear position and a delamination of the top and bottom cover tapes which resist the compression and/or tension forces resulting from being wound on a reel.

A further problem arises with the user. The rolled tapes on reels tend to be difficult to handle. A stiff or relatively stiff tape when wound on a reel tends to have a clock spring action when the reel is removed from its package and the user begins to unwind the tape for feeding into a placement machine. This leads to unnecessary time delays and occasional mishandling of reels during loading, thus causing delays in the utilization of automatic placement equipment. Further, winding of a relatively thick carrier tape tightly around a reel having a relatively small hub causes delamination of the carrier tape and/or of the top and/or bottom cover tapes. In the process of winding, the bottom cover tape will tend to be in compression and tend to delaminate from the bottom of the carrier tape; whereas the top cover tape will have a tendency to be in tension, thereby tending to delaminate from the carrier tape. In the case of plastic embossed tape, there is no bottom tape and the compression is partially absorbed by the component cavities. Delamination of cover tapes is a serious problem because it causes chips to fall out of the cavities and thereby disrupt the automatic placement process. The goal of an automatic placement process is to limit failures to one or two parts per million. Delamination of the cover tapes can cause the failure rate to exceed acceptable tolerances.

It is essential to the understanding of a multi-chip packaging system that one recognize the fact that the major products of the system are disposable and/or non-reusable items. Specifically, the tape, the reel and, in the case of the prior art, the container, case or package in which the reel is stored and/or shipped prior to use are all throw-away items. Hence, it is essential that the cost of these items be reduced to a bare minimum in the design of any new and/or improved system. In the present invention, a major point of novelty is the fact that the engineered laminated structures which comprise the tape and the reel are basically paper structures with minimal use of thin plastic films and the reel and the tape when fully assembled form a selfsealing package.

The EIA standard covers two variations of tape for leadless components, a carrier tape and a plastic embossed tape. The present invention does not offer a variation of a plastic embossed tape for several reasons. In particular, the plastic embossed tape is costly and is subject to delamination of the cover tape when wound on reels. The plastic embossed tape also suffers from the clock spring effect, an effect which is virtually eliminated by the present invention.

For understanding this engineered laminated tape, the reader is referred to the EIA proposed standard referred to above. Insofar as possible, the terminology used in this specification will be consistant with that of this EIA standard.

SUMMARY OF THE INVENTION

This invention pertains to a system for packaging leadless electronic components for automatic placement on a printed circuit board by means of automatic placement equipment. The leadless electronic components include chip capacitors, chip resistors, chip transistors, and chip integrated circuits, all of which in the present state of the art have a generally rectangular configuration. Certain cylindrical components, specifically capacitors, resistors, jumpers, mini-mold transistors, diodes and other components not specifically mentioned, may be utilized with this system for packaging leadless components provided that they may be taped in accordance the specifications of EIA standard proposal No. 1460. For purposes of simplification of the following exposition, all such components will be referred to as chips or chip components.

The packaging system of the present invention consists of low-cost, disposable, flexible, engineered laminated carrier tape for holding electronic chips in position as the chips are fed to automatic placement equipment; a low-cost, disposable reel having a relatively small diameter core; around which the carrier tape holding said electronic chips can be wound, the laminated carrier tape construction permitting the tape to be wound around such a core without damage to the tape or the chips held by the tape; and a method of constructing the flexible engineered laminated carrier tape; the method of putting chips onto the tape, making the final laminations to hold the chips in position on the tape, winding the tape onto the reels and sealing the tape to the reel to effect a self-contained, sealed package. In the system of the present invention a length of the tape wound upon a reel according to the method disclosed herein constitutes a sealed package or container, thereby eliminating the requirement for a further container or package, such as a box or plastic enclosure, to protect the tape itself and/or the components in the tape from enviromental conditions which would be detrimental to the products during storage and handling.

The engineered laminated carrier tape of the present invention solves the problems which have arisen in the prior art tapes by providing a flexible, engineered laminated carrier tape with a provision for tension and compression of the various layers of the laminated structure. The base layer member of the flexible, engineered laminated carrier tape has to remain a relativey stable, non-stretching member to engage a sprocket drive. The bulk of the carrier tape above the base is a laminated structure which is elastic in compression and tension, thus minimizing the tension and compression on the base member. The base layer of the carrier tape is a strong sheet of polycoated paper which serves as the primary member of the laminated stucture. The carrier tape having its strong paper base and one or more expandable or compressible upper layers is punched through the laminated structure with sprocket holes along one edge and cavities across the rest of the tape for holding chip components. The invention includes alternate embodiments for the flexible, laminated structure of the carrier tape, including laminates of plastic foams, polycoated papers and/or creped papers.

After the cavities are punched in the carrier tape, a bottom cover layer is applied to the carrier tape to hold the chips in place, by forming a base for the chip cavities. The bottom cover layer, which is narrower in width then the carrier tape to prevent obstruction of the sprocket holes, is a transparent plastic material to permit visual inspection of the loaded carrier tape. After chips are placed in the cavities of the carrier tape, a peelable top cover tape is applied with an adhesive or heat sealed to retain the chips in the cavities. The top cover tape layer will later be peeled from the carrier tape to permit the extraction of chips from carrier tape by automatic chip placement equipment. Hence to top cover tape is sealed in such a fashion that it can easily be peeled without damage to the tape or to the chips and without leaving any fragmentary residue which could cause a blockage in the vacuum pickup of an automatic chip placement machine. The top cover tape can be a paper or plastic creped material with or without polycoating.

The flexible, engineered laminated carrier tape provides a carrier tape which can be wound upon reels having small diameter core without damage to the components, and without delamination of the top or bottom cover tapes, since the flexible, engineered laminated carrier tape has a built-in capability of expansion and compression. In the preferred embodiment the construction described is a dry adhesive construction, the laminated layers being held together by a quick application of heat to polycoated layers of papers, foam and/or a closed-cell foam polyethylene, followed by an immediate cooling. This tape further provides a very low cost construction because it utilizes inexpensive standard polycoated paper and/or foams. The flexibility is maintained by incorporating creped paper and/or foam where necessary in the upper layers of the carrier tape and the cover tape. This construction has a further advantage of providing additional bulk or thickness by the simple addition of laminations to the carrier tape. Hence, if components become thicker, the basic structure does not have to be reengineered.

Other embodiments of the basic laminated structure can be achieved through variation of the materials used in the layers of this engineered laminated carrier tape. For instance, a soft elastic plastic rubber, tissue paper, creped paper or a rubber or plastic foam, could be substituted for some of the bulk laminations in the carrier tape.

The present invention also includes a reel on which the engineered laminated tape is wound. The reel consists of a core which, in the preferred embodiment, is constructed from cardboard discs secured together to provide a width of 8+ millimeters. In the preferred embodiment the cardboard core discs are made from solid fiber chipboard, which is a high quality chipboard having laminated thereto a hard sheet of paper on each side to provide strength and less warpage. The core discs, have a small center hole which may or may not be keyed with one or two or three key slots. (In the EIA standard three key slots are required.) The side flanges of the reel, termed for this invention side disc sheets, are fabricated from kraft paper, polyethylene coated on the inner side facing toward the wound carrier tape. The side disc sheets may be attached to the core prior to winding the carrier tape upon the core. After the carrier tape is wound on the reel, heat is applied through the kraft paper. The polyethylene coating of the side disc sheets contacting the edges of the carrier tape will soften and gently adhere to the wound up coil of carrier tape. Removal of the heat enables the polyethylene coating to set, thus providing a very stable, semi-rigid, non-tacky coil of carrier tape. The very thin coating of polyethylene on the kraft side disc sheets allows adhesion between the tape edges and the side disc sheet of kraft paper only. The carrier tape must not stick to itself, layer upon layer, in the coil. In usage, the carrier tape will gently pull or peel away from the side disc sheets without tearing the kraft paper. The coil of the carrier tape also has the beneficial characteristic of not being under spring tension. A rigid tape, cardboard or plastic wound upon a typical reel always tends to unwind itself. In the peel reel of the present invention, this will not happen. The tape will not unwind by itself because it is adhered to the side disc sheets of the reel. The reel design, thus, is a very low-cost product and is very adaptable to high speed automatic winding and/or unwinding applications.

BRIEF DESCRIPTION OF THE DRAWINGS

FIG. 3b is an enlarged cross-sectional view of the reel of FIG. 3a.

FIG. 4a is an exploded perspective view of the preferred embodiment of the chip carrier tape of the present invention.

FIG. 4b is an enlarged cross-sectional view of the tape of FIG. 4a.

FIG. 5a is an exploded perspective view of an alternate embodiment of the tape of the present invention.

FIG. 5b is an enlarged cross-sectional view of a tape of FIG. 5a.

FIG. 6a is an exploded perspective view of a second alternate embodiment of the tape of the present invention.

FIG. 6b is an enlarged cross-sectional view of the tape of FIG. 6a.

DESCRIPTION OF THE PREFERRED EMBODIMENT

The present invention pertains to a multi-chip packaging system for the packaging of leadless components, these packages to be used in automatic placement equipment for the placing of leadless components, hereinafter called chips, on a printed circuit board.

In the exposition of the preferred embodiment the reel will be described first, then the tape and then finally the method of assembling the finished package of taped chips on the reel of the present invention. The reel and the tape used in chip packaging are disposable items, that is, items that are not reusable and are simply discarded after the initial use. With this in mind, it is essential that these items be manufactured for as low a cost as possible.

The present invention utilizes characteristics of very thin plastic films and foams of the polyethylene and/or polypropylene type. These films which can be manufactured as extremely thin coatings or foams have a characteristic of tackiness when a slight amount of heat is applied to them. At average environmental temperatures up to about 150° F., these films are structurally solid and non-tacky. When a small amount of heat in the range of 250° F. to 350° F. is applied to these films, they become tacky and in effect can serve as adhesives or sealants. Consequently, in the fabrication of the reel and the tape of the present invention, this property is utilized by having thin plastic films serve as adhesive layers between the various laminations. The films or coatings also serve a further purpose, in that in the cool state they are impermeable and serve to protect the laminated tape and chips from the penetration of moisture and contaminants. Various papers or chipboards coated with one of these films are known in the trade as polycoated papers.

One goal of the present invention is to provide a low cost disposable reel, preferably within the definition of EIA standard proposal 1460. The critical specifications of this standard pertain to the outside diameter of the core, the thickness of the core, the three slots or internal key ways, the space between the side plates for tape and the overall thickness of the reel. Also two sizes of outside diameters are specified. In the prior art, two side plates and a hollow core or other type core without ribs, such as a tubing was utilized. The drive effect for the prior art came from the side plates.

Figure 1:
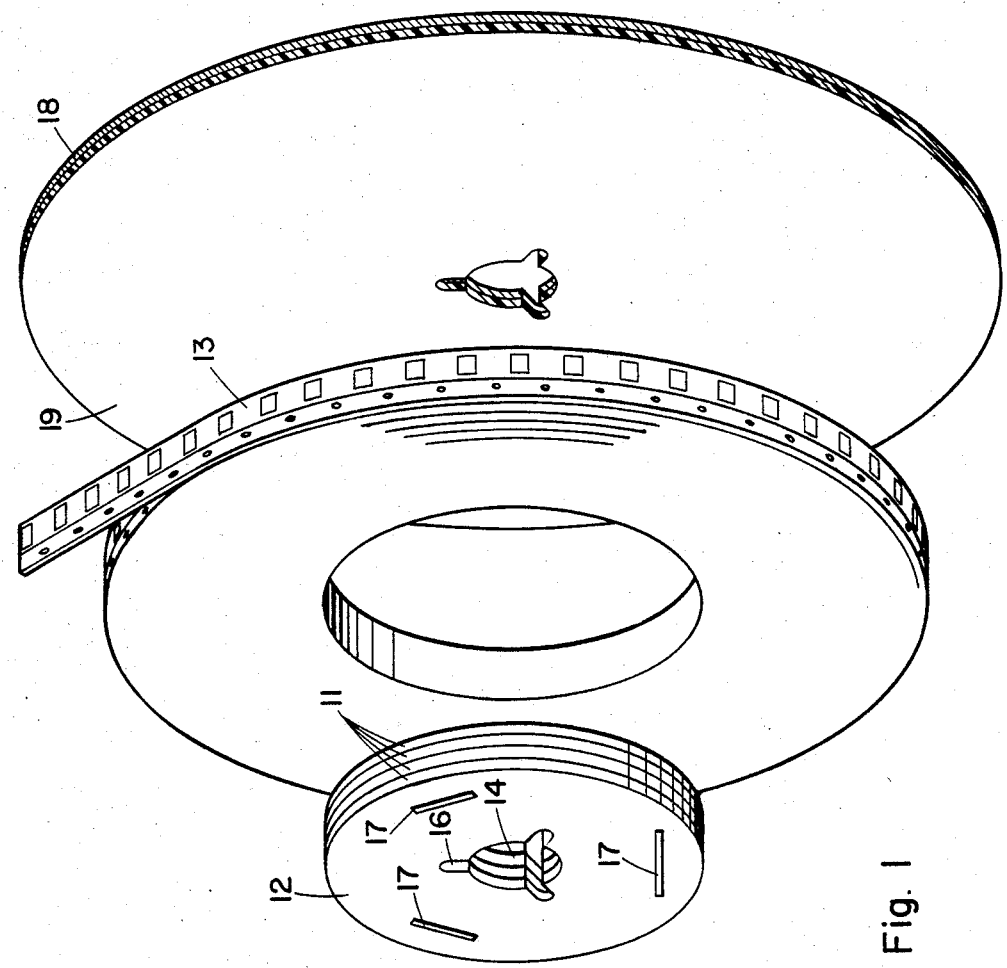
FIG. 1 is an exploded perspective view of the preferred embodiment of the reel of the present invention.
Figure 1:
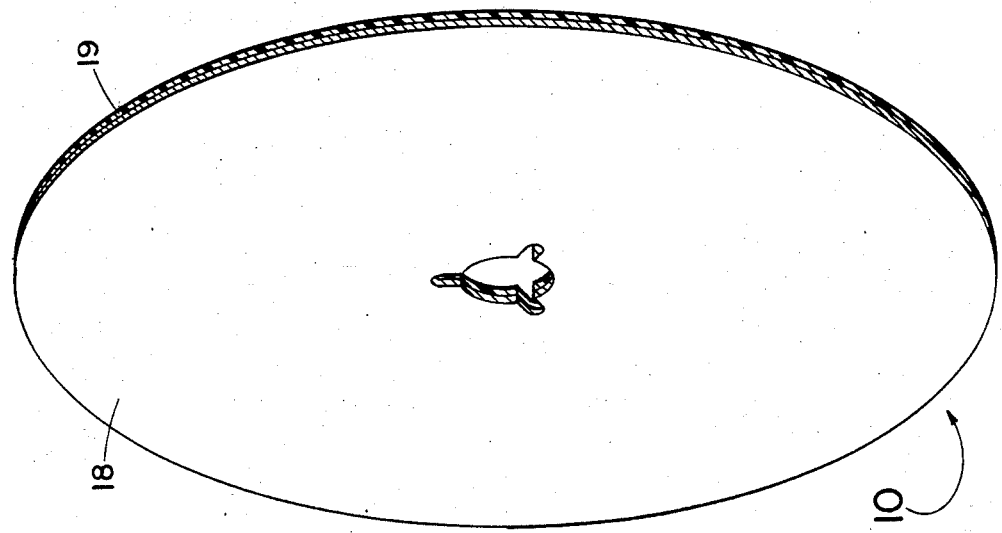

FIG. 1 is an exploded view of the reel of the present invention. This reel is intended to be a low cost, disposable replacement for conventional reels which have been traditionally made from plastic and/or metal. A conventional reel usually consists of a core piece and two relatively rigid and thick side plates or flanges. The side plates are usually slotted, the slots providing the drive mechanism for the reel. Referring to FIG. 1, in the present invention reel 10 has a core 12, which is a laminated solid core fabricated from four disc-shaped pieces 11 of solid fiber chipboard. In accordance with EIA standard proposal 1460, the width of the core should be 8.4 millimeters plus or minus 1.5 millimeters. The chipboard used is 80 point chip board, so that four laminations will produce 0.320 inches which falls within the EIA standard which, converted to inches, is 0.330 nominal. In the core 12 of reel 10, reel drive engaging means is provided by the three slots or key ways 16 provided about internal hole 14. The laminated structure of core 12 is obtained by placing four pieces 11 of 80 point solid fiber chip board on a mandrel and stapling these pieces together from each side, such that the staples 17 do not penetrate more than three layers.

Reel 10 further includes two side disc sheets 18, which are fabricated from a kraft paper which is polyethylene coated on one side, the coated side 19 facing toward the core 12. The side disc sheets 18 may be attached to the core 12 to form flanges for reel 10 prior to winding the carrier tape 13 upon the core. Side disc sheets 18 are adhered to core 12 by the application of heat to the kraft disc 18 so that polycoat 19 becomes tacky. The assembled reel is then cooled so that side plates 18 will remain adhered to the core 12. Assembled reel 10, FIGS. 2a, 2b, then has a drive mechanism in the core 12 and has on the exterior of its disc side plates 18 a paper surface which may be printed with product and manufacturer identification. A further advantage of using paper as the side disc plate 18 is that the thickness of the overall reel is much less then the maximum thickness provided by the EIA standard. This would permit, upon agreement of manufacturer and user, a wider tape to be used, thereby accomodating a larger size range of components. In this event, the core 12 would have to be enlarged, which is easily achieved by adding additional laminations 11 to the core. This novel reel design also permits a larger range of reel diameters, which can easily and inexpensively be arranged in standard increments. It also permits a greater number of reels to fit into automatic placement equipment.

Figure 2A:
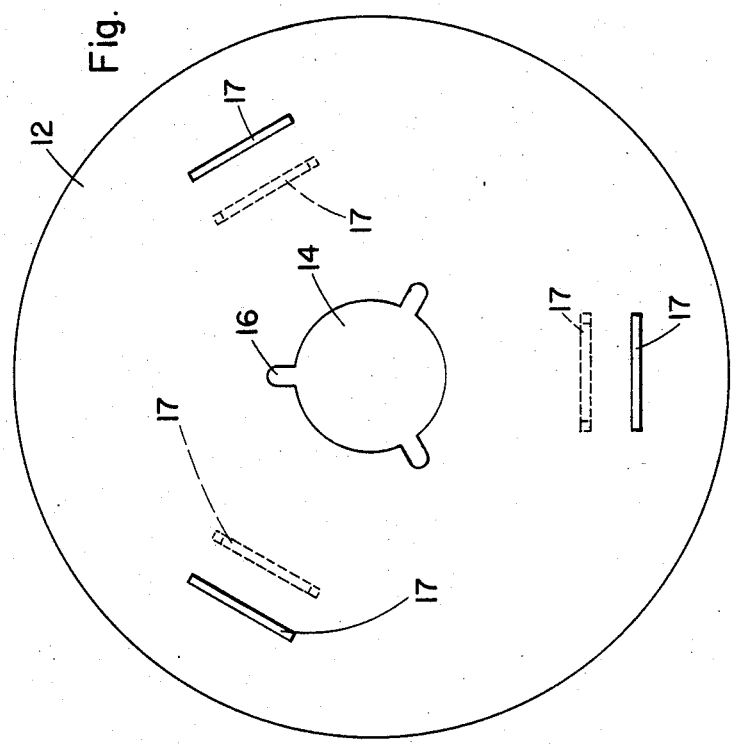
FIG. 2a is a plan view of the core of the reel of the present invention.
Figure 2B:
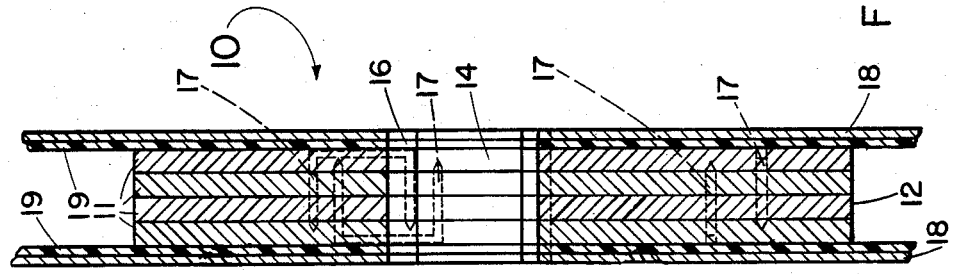
FIG. 2b is an enlarged cross-sectional view of the preferred embodiment of the reel of the present invention.

FIG. 2a is a plan view of the core 12 of reel 10 of FIG. 1. FIG. 2b is an enlarged cross-sectional view of reel 10 of FIG. 1 illustrating the relative position of the laminations of core 12 and the side disc plates 18 having polycoat 19. Core 12 as illustrated in FIG. 2a may also be utilized as a core for a more conventional type reel which is illustrated in FIGS. 3a and 3b and which will be discussed with reference to these figures.

In the present invention, reel core 12 serves as the point of rotation, the point of mounting for rotation, and keying, all in accordance with the EIA standard. The prior art sometimes uses an adapter in a hollow core to achieve these effects, but more commonly these effects are achieved through the solid side plates or flanges.

In accordance with the principles of the invention there can be many variations of the core material, which will be obvious to one skilled in the art. The preferred embodiment is that illustrated in FIG. 1.

Figure 3B:
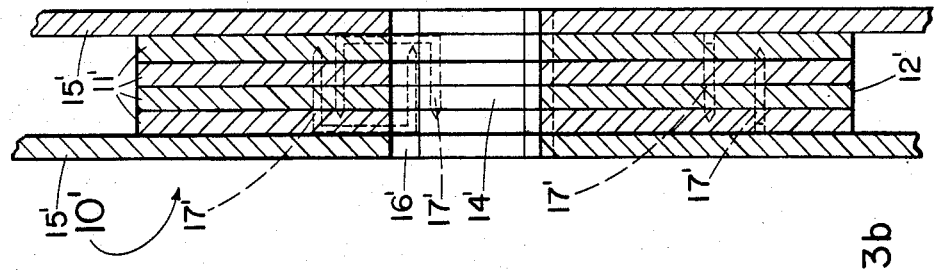
Figure 3A:
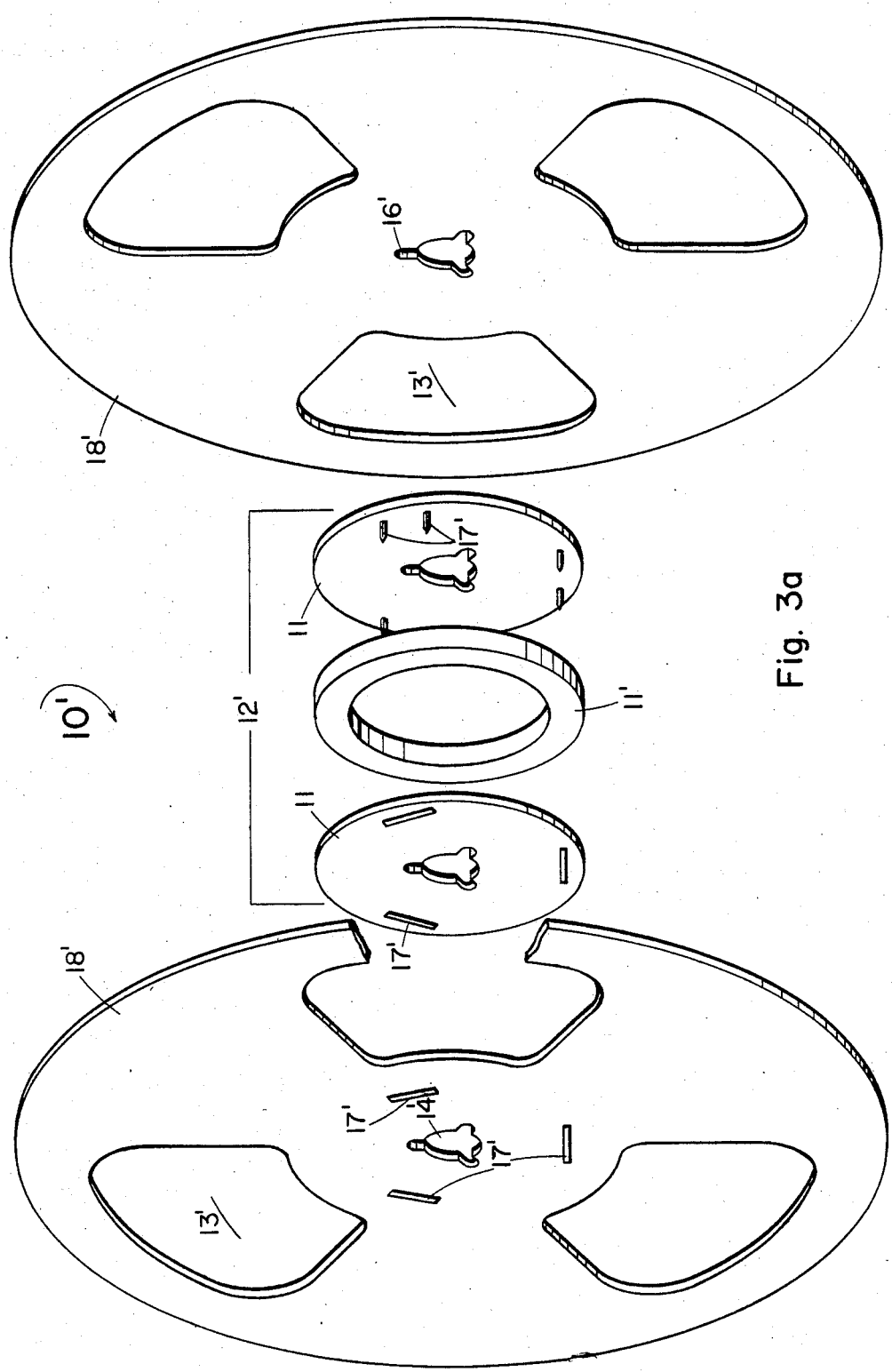
FIG. 3a is an exploded perspective view of an alternate embodiment of the reel of the present invention.

An alternate embodiment of reel 10 is illustrated in FIGS. 3a and 3b. This alternate embodiment is a more conventional type reel and does not feature some of the advantages of the preferred embodiment. However, it is an embodiment which represents an improvement over the present art in terms of manufacturing costs and utilization in the automated factory system. Reel 10' has a core 12' which contains two layers of discs 11 and a hollow tubular portion 11' substituting for the other two layers. The plan view of core 12' would be the same as that for core 12 of FIG. 2a. Core 12' need not be a solid core because the drive mechanism for reel 10' is partially in side plates 18' which are also made from 80 point solid fiber chipboard. Reel 10' then is a reel made completely from solid fiber chipboard. Because side plates 18' have a substantial thickness, part of the drive mechanism can come from the key ways 16' punched in the side plates 18'. Staples 17' are used to hold together the laminations in a manner similar to that of reel 10 of the preferred embodiment. In this case, however, the staples must also secure the side plates 18' as well as the core laminations 11 and 11'. In the illustration of FIG. 3b reel 10' is shown with a solid core, rather than with the tubular core 12' of FIG. 3a. The dimensions of reel 10' again fall within the nominal dimensional requirements of the above referenced EIA Standard Proposal. Reel 10' also features a conventional design in side disc plates 18 having three large apertures 13' for threading and viewing the tape.

The material for this alternate embodiment is also an 80 point solid fiber chipboard, 0.080 inches in thickness having a high quality sheet of kraft paper laminated to each side of the chipboard. The paper laminated on the chipboard gives strength to the chipboard and lessens warpage. It is, as mentioned previously, easy to expand or contract the width of core 12 by adding or deleting laminations. This can be accomplished without replacing any of the automated equipment on which core 12 is fabricated.

Returning to FIG. 1, the function of the polycoated interior sides of side disc sheets 18 will be discussed after the exposition of the structure of the tape 13, illustrated in FIGS. 4 through 7. The construction of side plates 18 may be varied by altering the materials used therein, as should be understood by those skilled in the art. However, it is preferred that the interior side of disc sheet 18 of FIG. 1 should be plastic coated because many types of paper contain sulphur or a compound thereof and the plastic coating serves to seal out sulphur from the air and the paper. This protects the silver terminations of components by providing a vapor barrier.

Though the sides 18 of reel 10 of FIG. 1 are very flexible, when taped components are wound about the core, the curvature of the tape adds mechanical strength to these side plates 18 when bonded or adhered by means of the plastic coating.

FIG. 4a illustrates the preferred embodiment of the low cost, disposable, flexible engineered laminated carrier tape of the present invention. Tape 80 of FIG. 4a provides a laminated structure having a certain thickness such that when this laminated structure is wound around the core of the reel, the lower portions of tape 80 will have minimal tension, while the upper portions will be expandable and compressible such that the tension on the upper portions will be absorbed by the flexible laminated structure. Hence, the base layer of tape 80 will be in equilibrium, while tension on the upper layers will be absorbed by the structure. Tape 80 has three principle components; a bottom cover tape 82, a carrier tape 84 and a top cover tape 86.

Carrier tape 84 is itself a laminated structure which, in the preferred embodiment according to EIA Proposed Standard 1460, is 8 mm wide, comprising a relatively strong and stable base layer member 87. In the preferred embodiment base layer member 87 is a strong plain paper. The second layer of carrier tape 82 is a high quality, closed cell, cross-linked foam polyethylene. One such product is FRELEN, available from Frelen Corporation, Billerica, Mass. Polyethylene foam 88 when heated becomes slightly tacky on its surface. Base paper layer 87 is laminated to polyethylene foam 88 by a short application of heat, followed by cooling. After this lamination, carrier tape 84 now provides the desired tape structure. Sprocket holes 90 and chip cavities 92 are then punched into carrier tape 84. Alternatively, cavities could be vacuum formed pockets in foam 88. Paper base layer 87 has to remain a relatively stable, non-stretching member of carrier tape laminate 84 to engage a sprocket drive. The foam portion 88 of carrier tape 84 is both elastic in compression and tension, thus minimizing the tension and compression on base member 87.

Bottom cover 82 in the preferred embodiment is a dual co-extruded clear, transparent plastic layer which, according to EIA Proposed Standard 1460 is 5.2 mm in width, so that it will not cover sprocket holes 90, the drive engaging means of the tape. Bottom cover tape 82 is a laminated structure having a bottom layer 94 which is a clear transparent temperature resistant and an upper layer 96 which is a thin coating of polyethylene. This bottom cover tape 82 is a product known as SCOTCH PAK 112 manufactured by the 3M Company which is a coextrusion of temperature resistant polyester and polyethylene. Bottom cover layer 82 is applied to base member 87 of carrier tape 84 by the application of heat which causes polycoat 96 to become tacky and adhere to paper base layer 87. After cooling, bottom cover 82 becomes a base for cavities 92, which are spaced recessed areas in tape 84. After chips are placed in cavities 92 of carrier tape 84, a top cover 86 which in the preferred embodiment is a plain creped paper 5.2 mm in width is placed on top of the cavities in carrier tape 84. Heat is then applied to this creped paper causing the upper surface of foam layer 88 to become tacky and top cover 86 to adhere to foam 88. When cooled, the laminated structure of tape 80 is completed. Since top cover 86 is a creped paper, only portions of its lower surface will adhere to foam layer 88, but these portions will substantially surround each individual cavity 92. This differs from present practices in which sealing is provided only two sides of the cavities. The limited adhesion of creped top cover 86 enables top cover 86 to be easily peeled from foam 88 and must not leave any fragmentary residue which could cause a blockage in the vacuum pickup of an automatic chip placement machine. Top cover 86 must be peeled from tape 80 in order for chips to be removed by the automatic placement equipment. The thickness of tape 80 can easily be controlled by the thickness of foam layer 88. Hence, the tape is adaptable to chip components of varying thicknesses without a major reengineering of the tape or the tooling for making the tape.

FIG. 5a, illustrates an alternate embodiment of the carrier tape for leadless components. Tape 20, as shown in this perspective exploded view, includes a carrier tape 22, a bottom cover tape 23 and a top cover tape 21. Carrier tape 22 is a laminated structure having as a bottom layer a sheet of strong paper 25 with a polycoat 26 on its upper surface. The next layer of the carrier tape is a sheet of a plastic foam 27. The foam must be a clickable foam and its thickness must be approximately the thickness of the components to be held in tape 20. Foam 27 is laminated to the polycoating on the strong base paper by heat sealing. The next layer of the carrier tape 22 is a layer of creped paper 29 with a thin polycoat on its upper side. Creped layer 29 is sealed to foam 27 by an adhesive coating 28. Laminated carrier tape 22 then comprise in upward order, a sheet of strong base paper 25, a polycoating 26, a sheet of foam 27, an adhesive 28, a crepe 29 and a polycoat 30, all constituting the carrier tape 22 which is 8 millimeters wide. Carrier tape 22 then has sprocket holes 40 punched through along one edge and chip component cavities 42 punched through at the spaced intervals along the bulk of tape 22. Having punched the carrier tape 22, a clear transparent bottom cover tape 23 is laminated to the carrier tape structure in such a way that it covers the cavities but does not cover the sprocket holes. Cover tape 23 is the co-extruded tape described with reference to FIG. 4a. This clear transparent material is a plastic which is also heat sealed to the bottom of paper layer 25. Since at the time of this lamination no chips are in cavities 42, layer 23 can have a coating 24 of polypropylene or polyethylene, providing a non-tacky surface at the base of each cavity when cooled. The top cover tape 21 is a piece of plain creped paper, which is heat sealed to the upper polycoating 30 on the creped paper layer 29 immediately below it. This cover layer 21 is intended to be a peel-away layer to give access to the chips in the automatic placement equipment. The bonding of the top creped paper layer 21 to a polycoated creped paper layer 29 provides a random tack seal around the periphery of the chip cavity 42, in sharp contrast to the present practice, which only strip bonds the cover layer along two sides of each cavity. Because the cover creped paper is bonded to a polycoated creped paper, the bond is random, only the peaks being bonded. This means that the cover layer 21 is relatively easy to pull off, peel-away or separate from the carrier tape. However, the random tack of the cover sheet substantially surrounds the cavities 42.

The engineered laminated constuction described with reference to FIG. 5a, provides a transparent bottom cover 23, through which a visible check may be made to ensure that the chips are in each cavity. The layers above the stable base layer 25 of the carrier tape are flexible layers 27 and 29, which permit both expansion and contraction. Hence, when tape 20 is wound upon a reel, the upper layers can expand somewhat to account for the greater diameter at the top of tape 20 then at the bottom of the tape 20. The fact that tape 20 is compressible also makes it easier to remove a chip component from a cavity 42 in tape 20. In some present chip placement machines, a chip is removed by piercing the bottom transparent cover and pushing the chip upwards to be then picked up by a vacuum probe or a set of jaws. With the compressible construction of the carrier tape of this invention, there is no need to pierce the bottom transparent layer 23. The pick-up tool may reach down and compress the tape layer and grip the part while it is in the tape cavity. The part may then be lifted out from the compressed carrier tape 22. This permits a positive grip on the chip.

As mentioned previously, the bottom cover 23 and strong base layer 25 never stretch or compress, the base layer 25 being a stable member of the laminate and the upper layers being expandable and compressible members of the laminate structure. Given this structure of the carrier tape, the clock spring effect of wound tape is substantially minimized.

Figures 6A, 6B:
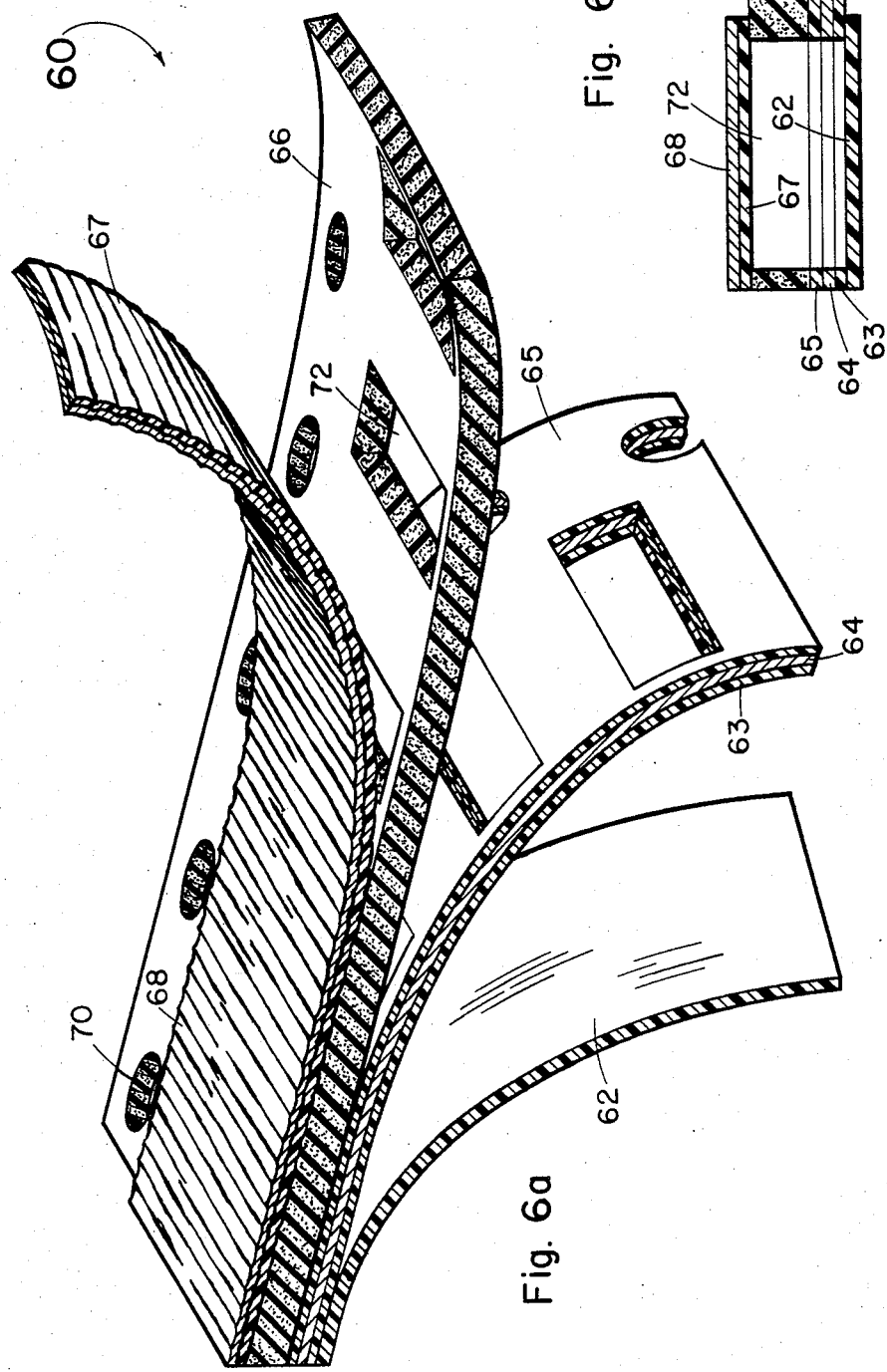

FIGS. 6a and 6b illustrate another alternate embodiment of the tape of the present invention. In the embodiment of FIGS. 6a and 6b tape 60 has a bottom cover layer 62 which is simply a transparent plastic material. The base 64 of the carrier tape is a double polycoated paper. The lower polycoat is used for adhering plastic bottom cover 62 and the upper polycoat is used for adhering to a foam layer 66. The top cover layer 68 is a polycoated crepe with polycoat facing inward toward the foam. Top cover 68 cannot be adhered to the foam carrier layer 66 by a total application of heat because the polycoat 67 would also adhere to the chips. To avoid this problem, top cover 68 is adhered by rolling two hot wheels along the side perimeter of each cavity 72. This serves to loosely seal the top cover to the foam layer 66. However, the seal does not go around the total perimeter of cavities 72. The embodiment in FIGS. 6a and 6b also illustrates an alternative for the bottom cover tape structure. In this case the adhesive polycoat 63 is on the paper base layer member 64 rather than on the clear plastic layer 62. This alternative may be used in the other embodiments illustrated with this application. The use of a polycoated creped top cover 68 is not preferred because the sealing is less complete than desired for optimal performance. However, this alternative may also be used in the other embodiments disclosed in the present application. It should be pointed out that the linear sealing required for this embodiment is approximately equivalent to the linear sealing used in presently available tapes which do have a tendency to delaminate because of excessive tension on the top noncreped cover tape. It is believed that having a flexible laminated carrier tape such as that disclosed in this embodiment that the delamination of the cover tape will minimized. A creped top cover tape on any prior tape would also minimize this delamination.

FIGS. 7a through 7f are enlarged cross-sectional views of other alternate embodiments of the tape of the present invention. These embodiments should be easily understood by those skilled in the art and in view of the disclosures about the prior alternatives.

Figure 7A:
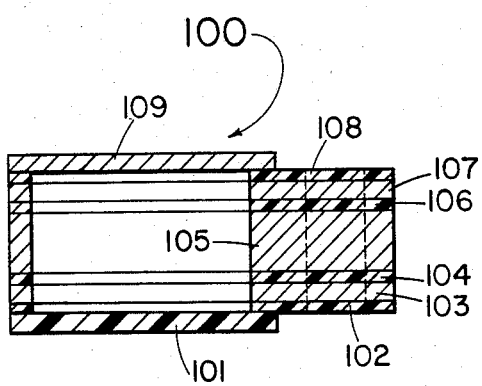
FIGS. 7a through 7f are enlarged cross-sectional views of alternate embodiments of the tape of the present invention illustrating minor variations of the construction disclosed in FIGS. 4, 5 and 6.

FIG. 7a illustrates a flexible engineered laminated tape having as its various laminate layers a clear plastic bottom cover tape 101, a double polycoated strong paper layer 103 with polycoats 102 and 104, a bulk layer 105 which may be tissue paper, a polyester foam, or a polyurethane foam, a layer 106 which is an adhesive on top of bulk layer 105 or a polycoat on top of bulk layer 105, a polycoated crepe paper constituting layers 107 and 108 and a plain creped paper cover tape 109.

Figure 7B:
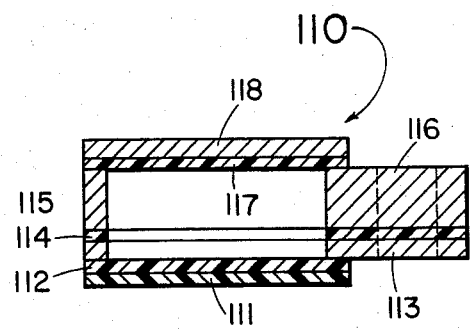

FIG. 7b illustrates an alternative embodiment of a tape 110 which is slight variation of the tape illustrated in FIG. 7a. In the case of tape 110 a co-extruded plastic is used as a bottom cover tape 111 and a polycoated creped paper is used as the top cover tape 118.

Figure 7C:
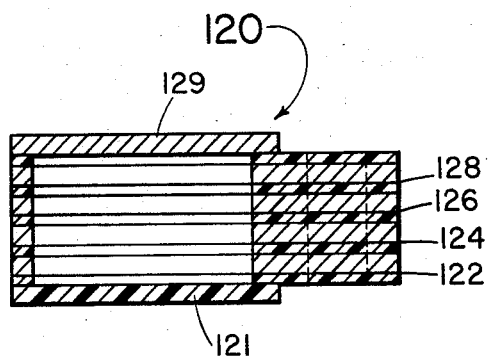

FIG. 7c illustrates an interesting alternate embodiment of the tape of the present invention.

In this alternate embodiment the tape 120 is a laminated structure constructed from multiple layers of polycoated creped paper 124–128, the polycoat being on the upper side. The polycoated creped layers rest on a base layer 122 which is a strong piece of paper polycoated on both sides. The number of creped layers is a function of the desired thickness of the carrier tape. Since the multiple layers of the carrier tape are polycoated on their upper sides, the application of heat will cause these layers to adhere to form a bulky, yet expandable tape, since the creped layers are expandable and/or compressible.

A plain creped paper top cover tape 129 is used. Since there is no polycoating on the bottom side of the top cover tape, the top cover tape will not adhere to the chips. However, since the top layer of the carrier tape is polycoated, the plain creped cover tape will adhere to the top layer of the carrier tape. Furthermore, since the top layer of the carrier tape and the cover tape are both creped, this adhesion will be random, permitting easy peeling of the top cover tape.

The carrier tape is made by laminating the layers described above in one step, and then punching sprocket holes along one edge and cavities for chip components in the remainder of the tape at spaced intervals according to the EIA standard. The bottom cover tape 121 is a transparent plastic. The bottom tape is applied to the carrier tape prior to the insertion of chips to provide a base for the chip cavities. The chips are placed in the carrier tape having a bottom cover tape as they are discharged from an automatic testing/feeding machine to insure that each component placed in the carrier tape is a working component. After the chips are inserted in the cavities in the carrier tape, the top cover tape is then applied.

Figure 7D:
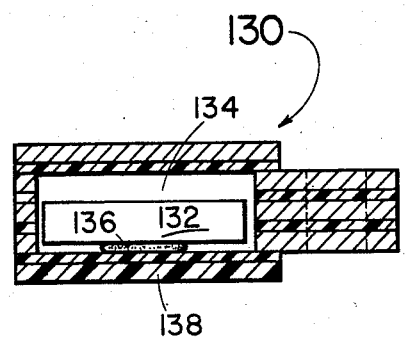

FIG. 7d is an alternate embodiment of FIG. 7c in which a chip 132 is shown in a cavity 134. At the base of chip 132 is a layer of non-tacky, non-activated adhesive 136 which must not secure chip 132 to bottom cover layer 138. Adhesive 136 will later be activated to adhere chip 132 to a printed circuit board. In this embodiment the adhesive 136 is placed on the chip prior to its packaging rather than being placed on the circuit board.

Figure 7E:
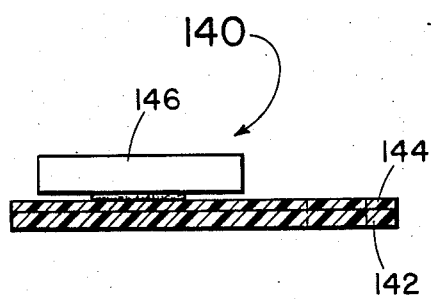

FIG. 7e illustrates the simpliest embodiment of a chip carrying tape. In this embodiment a base structural member 142 serves as the basic carrier tape. A chip 146 is temporarily adhered to base member 142 such that chip 146 may be easily removed. 144 in this illustration can be a coated surface.

Figure 7F:
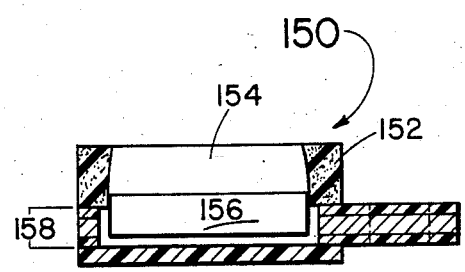

FIG. 7f illustrates a very desirable alternate embodiment of the present invention. In FIG. 7f the basic point of novelty is that the top cover tape is omitted completely. The expandable and compressible layer 152 is preferably a foam-type substance in which a cavity 154 is formed slightly smaller than the overall dimensions of chip 156. Hence, when chip 156 is inserted into undersized cavity 154 it is in effect friction fitted and held in position by foam 152. The remaining layers of the laminate comprising tape 150 may have any of the constructions described or illustrated previously. Base structural member 158 which has sprocket holes, could be of any construction which has the required stability.

The various embodiments disclosed and illustrated herein may be modified in any of a number of ways including modifications including the fact that modifications from one embodiment may be incorporated into another embodiment with which they would be consistent. The basic principle of the invention, however, remains the same, namely, to provide a low cost, disposable, flexible engineered laminated tape for holding chips to be fed to automatic chip placement machinery.

Referring now back to FIG. 1 and the description of reel 10 contained therein and to FIGS. 4 through 7f and the descriptions with reference thereto, when a tape such as tape 80 of FIG. 4a or the alternate embodiments thereof is wound onto reel 10 to the desired length, the tape is then terminated according to industry standards such as EIA proposed standard 1460. Having fully wound the desired tape on reel 10, heat is then applied to side disc sheets 18 so that polycoat 19 becomes soft and tacky. The edges of tape 80 will then adhere to polycoated side 19 of disc sheet 18. After cooling, the combined reel 10 and tape 80 form in effect a sealed package of reeled tape. This total package thus provides a stable, semi-rigid, non-tacky coil or reel of chip holding tape. The tape itself must not, according to the EIA standard, and will not stick to itself, layer upon layer in the wound reel. The wound reel or coil of tape also has beneficial characteristic of not being under spring tension, and cannot unwind by itself, because the edges of the tape are adhered to side disc sheets of the reel. The fact that reel 10 when wound with a tape such as tape 80 and then heat sealed forms a completely sealed package having the beneficial effect of eliminating the need for a separate container for storage. Even though the side discs 18 of reel 10 are very flexible, when taped components are wound about the core on a tape such as tape 80, a curvature of the tape adds mechanical strength to side sheets 18 when these sheets are bonded and/or adhered by means of the polycoat 19.

If reel 10' illustrated in FIGS. 3a and 3b is used for winding tape 80 or any other embodiment of the tape disclosed herein, then the sealing of the tape within the reel is not possible. However, the clock spring effect is greatly minimized the fact that the tape is a flexible sandwich having upper layers which are compressible and/or expandable as the need may arise. A separate container would be required for a wound reel of tape using the embodiment of these figures.

The use of automatic chip placement equipment requires that the tape be fed from the reels with a relatively constant tension and be free of any contamination. The variables that must be considered are the unwinding tension of the reel, the thickness of the polycoat 19 on the side discs 18, the temperature of the bonding of the tape to the side discs 18, and the percent of the surface of the sides of the tape which have been bonded to side discs 18. To achieve a smooth unwinding and consequently a breaking of the seal between the sides of the tape and side discs 18, requires control of these variables. One can limit the bonded surface by bonding in radial lines or widths. The control of the bonding temperature and the thickness of the polycoat should be such that no residue is left when the tape is pulled away from the side sheets of the reel. The goal is to have a residue free, peel-away tape, such that the tape unwinds with no contamination which could possibly clog vacuum holes in the automatic chip placement machinery. Furthermore, no tackiness should be present in the tape as it is fed to the automatic chip placement machine. This is one of the reasons why polyethylene, polypropylene or a similar substance is used for the coating. These various poly substances are soft and tacky when heated and will effect adhesion between laminated parts. However when they are cooled, the adhesion remains while the tackiness disappears. It should be clearly understood that polypropylene and polyethylene are only two representative materials. Another modified polymer or adhesive which will yield the same results without providing a string residue would also work. It would appear that various forms of granular polymers would suffice. Other variables for achieving a residue free, peel-away are reasonably well known. The type of paper must be selected, the type of plastic coating must be suitable, and the temperature of sealing must be controlled. Furthermore, this permits predictable tension for unwinding the tape.

In summary, the reel and tape combination is a low cost replacement for the conventional reels and tapes commonly available. The use of core 12 as described herein eliminates the need for rigid, thick and expensive side plates. The tape itself as fabricated according to the disclosure herein becomes a rigid self-supporting member when wound on and sealed to side plates 18 of reel 10. Hence, expensive rigid side plates are not needed for reel 10. Common sheets of polycoated kraft paper, such as side discs 18, 19 can suffice.

In reel 10, core 12 provides the point of rotation, mounting and keying in accordance with the EIA standard. Reel 10 and core 12 are adaptable to an automatic process for fabrication and utilization in automatic chip placement machinery. Less labor is involved in the use of taped parts which are made in accordance with the invention herein. The carrier tape itself is compressible. To remove the part, no piercing of the bottom tape is necessary. The part is simply lifted out by compressing the carrier tape around the part. This permits the use of a positive grip.

In the construction of reel 10, the flanges of reel 10 are simply two sheets of kraft paper 18 having a polycoating 19. The paper may be of any color. The paper should have minimum sulphur content, because sulphur tends to tarnish silver contacts. The polycoating helps to prevent the penetration of moisture into the package and also the penetration of sulphur. The need for an extra container for storage of reel tapes is thereby eliminated. The reel when loaded with tape and sealed as described above provides a self-contained sealed and polycoated package. The fact that the tape is curved when wound upon core 12 and then sealed to side discs 18 add strength to the package and provides a monolithic structure.

Referring back to FIG. 2a of the present drawings, the use of thin side discs 18, permits the reel width to fall well under the minimum reel width specified by the EIA standard. When the difference is calculated, approximately 6.5 additional millimeters of space become available on the tape as a result of this space savings. Consequently, the reel and tape of the present invention permit, if manufacturers agree, the use of a wider tape than 8 millimeter tape. This would permit larger size components to be packaged in the tape of the present invention. Alternatively, it allows greater density of chip components on the pc board by allowing closer positioning of reels on chip placement equipment, thereby obtaining the higher density of chip components of pc boards.

In the alternate embodiments, polyester foam is used for a compressible carrier tape. However, this could very well be polyurethane, or any other rubber or flexible, compressible foam which would have the properties necessary to bond into the laminated structure.

The present invention then provides a tape which is a flexible sandwich that can accomodate components of varying thicknesses. The peel reel can dispense with the conventional reel. This has many advantages as should be apparent. The polycoated paper which forms side discs in the peel reel when heated is afixed to the edge of the tape and provides for a controlled tension of tape during unwinding. The tape itself becomes the support mechanism after unwinding. The tape is peeled off from the tape reel package. The mechanical help of flanges on a conventional reel has been dispensed with, because the tape itself provides rigidity for the package when sealed to side plates. Furthermore, it also provides a sealed package, eliminating the need for a separate container.

I claim:

1. A low cost, disposable, flexible engineered laminated tape for holding leadless components for feeding said components to automatic component placement machines comprising:
   a stable base layer member of said laminated tape;
   at least one flexible, expandable and compressible upper member layer of said laminated tape;
   means to laminate said base layer and said upper layer members to form a monolithic laminated carrier tape structure;
   tape drive engaging means integrally formed in said carrier tape;
   spaced recess areas in said carrier tape for receiving said leadless components;
   a bottom cover tape secured to said base member layer and dimensioned such that said bottom cover tape covers the base of each of said spaced recess without obstructing said tape drive engaging means;
   a top cover tape dimensioned to cover the open tops of said spaced recesses without obstructing said tape drive engage means;
   said top cover tape being a stretchable, thin material randomly adhered around the periphery of said spaced recesses; and
   said top cover tape being removably secured to said upper member layer such that it may be peeled therefrom to yield the access to said components by an automatic component placement machine without leaving a fragmentary residue.

2. The laminated tape of claim 1 wherein said stable base layer is a sheet of strong paper.

3. The laminated tape of claim 1 wherein said flexible, expandable and compressible member is a closed cell, cross-linked foam polyethylene.

4. The laminated tape of claim 1 wherein said spaced recesses are formed in said base layer and in said upper member layer.

5. The laminated tape of claim 1 wherein said top cover tape is a creped paper and said top cover tape is randomly adhered to said upper member layer by heat sealing.

6. The laminated tape of claim 1 wherein said bottom cover layer is transparent.

7. The laminated tape of claim 1 wherein said bottom cover tape is a coextruded clear plastic, one of said extrusions being a thin, heat sealable plastic film.

8. The laminated tape of claim 7 wherein said coextruded clear plastic bottom cover tape is a coextrusion of a temperature resistant plastic and a low melt temperature plastic.

9. The laminated tape of claim 1 further including:
   means permitting the inspection of said spaced recessed areas to determine the presence or absence of components in each of said spaced recess areas after said tape is loaded with components and said top and bottom cover tapes are adhered.

* * * * *